United States Patent
Chien (10) Patent No.: US 7,221,234 B2
(45) Date of Patent: May 22, 2007

(54) VCO WITH SWITCHABLE VARACTOR FOR LOW KVCO VARIATION

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 11/084,420

(22) Filed: Mar. 18, 2005

(65) Prior Publication Data

US 2006/0208806 A1    Sep. 21, 2006

(51) Int. Cl.
*H03B 5/12* (2006.01)

(52) U.S. Cl. ............................. 331/177 V; 331/36 C; 331/117 FE; 331/179

(58) Field of Classification Search ............. 331/36 C, 331/117 R, 117 FE, 117 D, 177 R, 177 V, 331/179
See application file for complete search history.

(56) References Cited

U.S. PATENT DOCUMENTS 5,648,744 A * 7/1997 Prakash et al. ............... 331/11
5,739,730 A * 4/1998 Rotzoll .................... 331/177 V
6,621,362 B2 * 9/2003 Momtaz et al. ......... 331/117 R

OTHER PUBLICATIONS

R. Castello, P. Erratico, S. Manzini, F. Svelto, "A ±30% Tuning Range Varactor Compatible with Future Scaled Technologies," 1998 IEEE, pp. 34-35.

* cited by examiner

*Primary Examiner*—David Mis
(74) *Attorney, Agent, or Firm*—McAndrews, Held & Malloy, Ltd (57) ABSTRACT

A method and system for VCO with switchable varactor for low KVCO variation is provided. Aspects of a method for controlling a signal may comprise controlling an oscillating frequency of a time varying signal in a circuit, and controlling a change in the oscillating frequency based on switching of a plurality of varactors. The switching of the varactors may control a change in the oscillating frequency based on a control voltage. The method may further comprise minimizing a change in the rate of change in the oscillating frequency based on the switching of the varactors. Aspects of a system for controlling a signal may comprise circuitry that controls an oscillating frequency of a time varying signal in a circuit, and circuitry that controls a change in the oscillating frequency based on switching of a plurality of varactors. An executable computer program may cause a machine to execute steps as described above.

23 Claims, 9 Drawing Sheets

VCO WITH SWITCHABLE VARACTOR FOR LOW KVCO VARIATION

CROSS-REFERENCE TO RELATED APPLICATIONS/INCORPORATION BY REFERENCE

Not Applicable.

FIELD OF THE INVENTION

Certain embodiments of the invention relate to analog circuit design. More specifically, certain embodiments of the invention relate to a method and system for a voltage controlled oscillator (VCO) with switchable varactor for low KVCO variation.

BACKGROUND OF THE INVENTION

A circuit that generates a signal for which an oscillating frequency of the signal is proportional to an applied voltage may be known as a voltage controlled oscillator (VCO). A device for which the capacitance value varies based on an applied voltage may be known as a variable reactance, or varactor. The oscillating frequency of a VCO may be controlled by utilizing a varactor. The value of KVCO may control the amount by which the oscillating frequency of a time varying signal generated by a VCO may change based on a change in the voltage level of a control signal. In operation, the value of KVCO in a VCO may vary widely due to a plurality of factors. A change in KVCO may change the rate at which the oscillating frequency of the VCO may change due to changes in the control voltage. One or more of these factors may also result in changes in the oscillating frequency of the time varying signal generated by the VCO independent from changes in the control voltage. In addition, an amplitude of the time varying signal may change due to one or more of these factors. Some conventional VCO designs may not be able to adapt the VCO circuitry to compensate for this plurality of factors such to stabilize values of KVCO, the oscillating frequency of the VCO for a given control voltage level, and the amplitude of the time varying signal generated by the VCO.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a VCO with switchable varactors for low KVCO variation, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
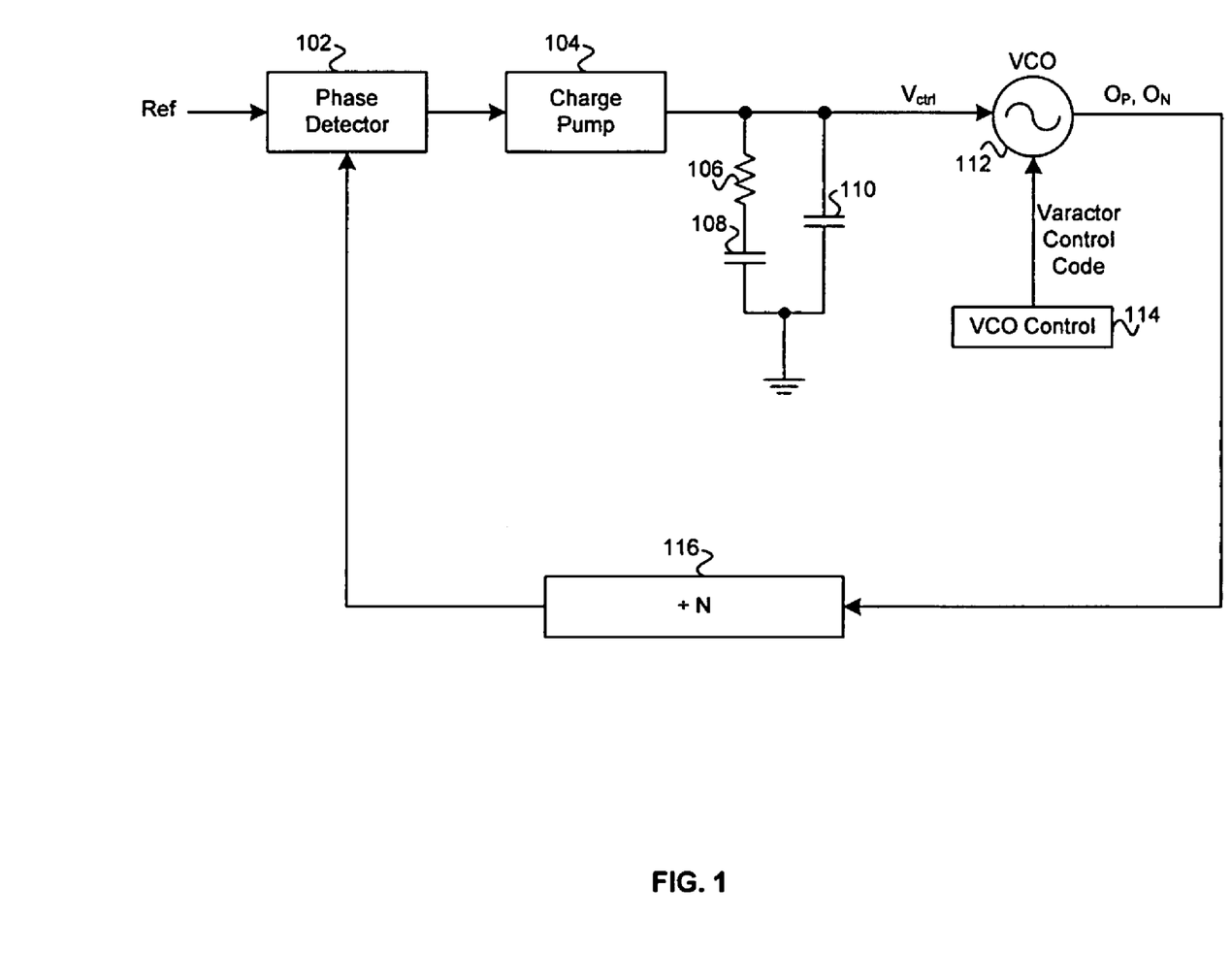
FIG. 1 is a block diagram of an exemplary phase locked loop circuit, in accordance with an embodiment of the invention.

Certain embodiments of the invention may be found in a method and system for VCO with switchable varactor for low KVCO variation. FIG. 1 is a block diagram of an exemplary phase locked loop (PLL) circuit, in accordance with an embodiment of the invention. Referring to FIG. 1 there is shown a phase detector block 102, a charge pump block 104, a resistor 106, a plurality of capacitors 108 and 110, a voltage controlled oscillator (VCO) 112, a VCO control block 114, and a divide by N (÷N) block 116. Also shown in FIG. 1 are a reference signal (Ref), a control voltage signal ($V_{cntl}$), a varactor control code, and time varying signals output positive ($O_P$), and output negative ($O_N$). The resistor 106, and plurality of capacitors 108 and 110, may be components in a loop filter. The loop filter may be characterized by an impedance that varies as a function of frequency, $Z_{loop}(s)$, where the variable s may represent the frequency of a signal applied to the loop filter.

In operation, a PLL may receive a reference signal, Ref, that is an input to a phase detector 102. The phase detector 102 may compare the reference signal ref to the time varying signals that may be output from the VCO 112, $O_P$ and $O_N$. The phase detector 102 may output a signal based on the phase difference between the reference signal, Ref, and the time varying signals, $O_P$ and $O_N$. Prior to comparison at the phase detector block 102, the time varying signals, $O_P$ and $O_N$, may be processed by the divide by N block 116. The output from the phase detector may be received by the charge pump block 104, which may generate a current, i(s). The average direct current (DC) component of the current i(s) may be proportional to the phase difference between the reference signal, Ref, and the signal generated by the processing of the time varying signals $O_P$ and $O_N$ by the divide by N block 116. The current generated by the charge pump block 104, i(s), may be applied to the loop filter to produce a control voltage $V_{cntl}$:

$$V_{cntl} = Z_{loop}(s)i(s) \qquad \text{equation [1]}$$

The control voltage signal, $V_{cntl}$, may be input to the VCO 112. The VCO 112 may generate the time varying signals, $O_P$ and $O_N$, based on the control voltage signal, $V_{cntl}$, and the varactor control code. The varactor control code may be generated by the VCO control block 114. The VCO control block 114 may utilize machine readable storage having stored thereon, a computer program having at least one code section that is executable by a machine, which causes the machine to generate a varactor control code. The varactor control code may comprise a plurality of binary bits.

Figure 2:
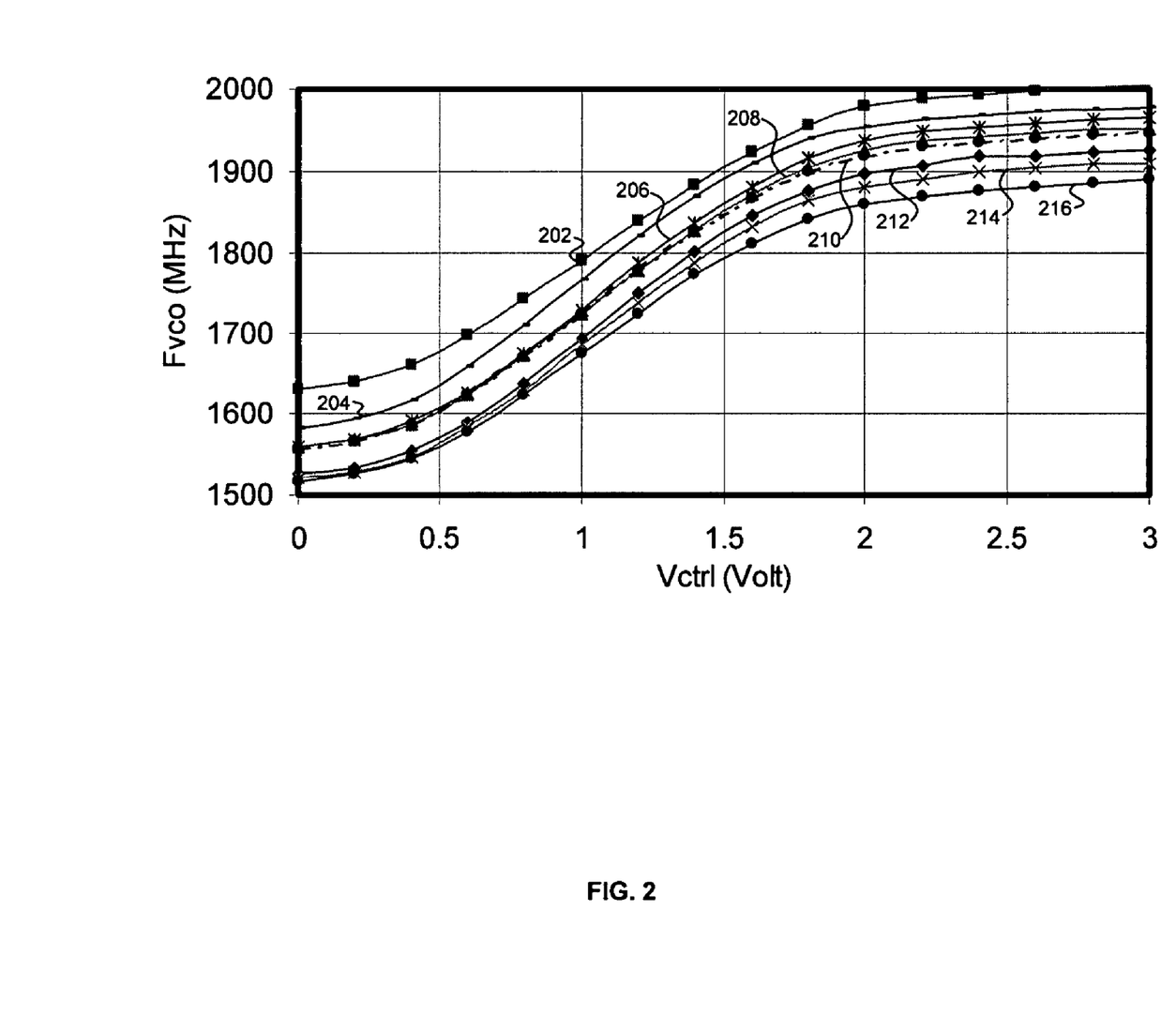
FIG. 2 is a chart illustrating exemplary oscillating frequency versus control voltage, in accordance with an embodiment of the invention.

FIG. 2 is a chart illustrating exemplary oscillating frequency versus control voltage, in accordance with an embodiment of the invention. With reference to FIG. 2, there is shown a plurality of graphs 202, 204, 206, 208, 210, 212, 214, and 216. Each of the plurality of graphs 202, 204, 206, 208, 210, 212, 214, and 216 may represent a series of measurements of the oscillating frequency, $F_{VCO}$, of a time varying signal, such as, for example, $O_P$ or $O_N$, that is output from a VCO 112 based on a control voltage $V_{cntl}$. The variable KVCO may be defined as the change in $F_{VCO}$ based on a change in $V_{cntl}$:

$$KVCO = \frac{dF_{VCO}}{dV_{cntl}} \qquad \text{equation [2]}$$

where KVCO may be represented in FIG. 2 based on the slopes of the graphs 202, 204, 206, 208, 210, 212, 214, and 216.

In operation, the value of KVCO may vary from a nominal value, $KVCO_{nominal}$, by 50% to 200%:

$$0.5\ KVCO_{nominal} \leq KVCO \leq 2\ KVCO_{nominal} \qquad \text{equation [3]}$$

A change in KVCO may represent a rate at which the oscillator frequency of the VCO, $F_{VCO}$, may change based on a change in the control voltage $V_{cntl}$.

The value of KVCO may change based on a plurality of factors. For example, the value of KVCO may change based on the amplitude of the time varying signals, $O_P$ and $O_N$, such that for large amplitudes of the time varying signals, the value of KVCO may be smaller. In this regard, factors that cause a change in the amplitude of the time varying signals, $O_P$ and $O_N$, may induce a corresponding change in the value of KVCO.

Various embodiments of the invention may control factors that cause a change in the amplitude of the time varying frequency signals, $O_P$ and $O_N$. Other aspects of the invention may control factors that may cause a change in the oscillating frequency the signals $O_P$ and $O_N$, which may be generated by the voltage controlled oscillator (VCO).

Figure 3:
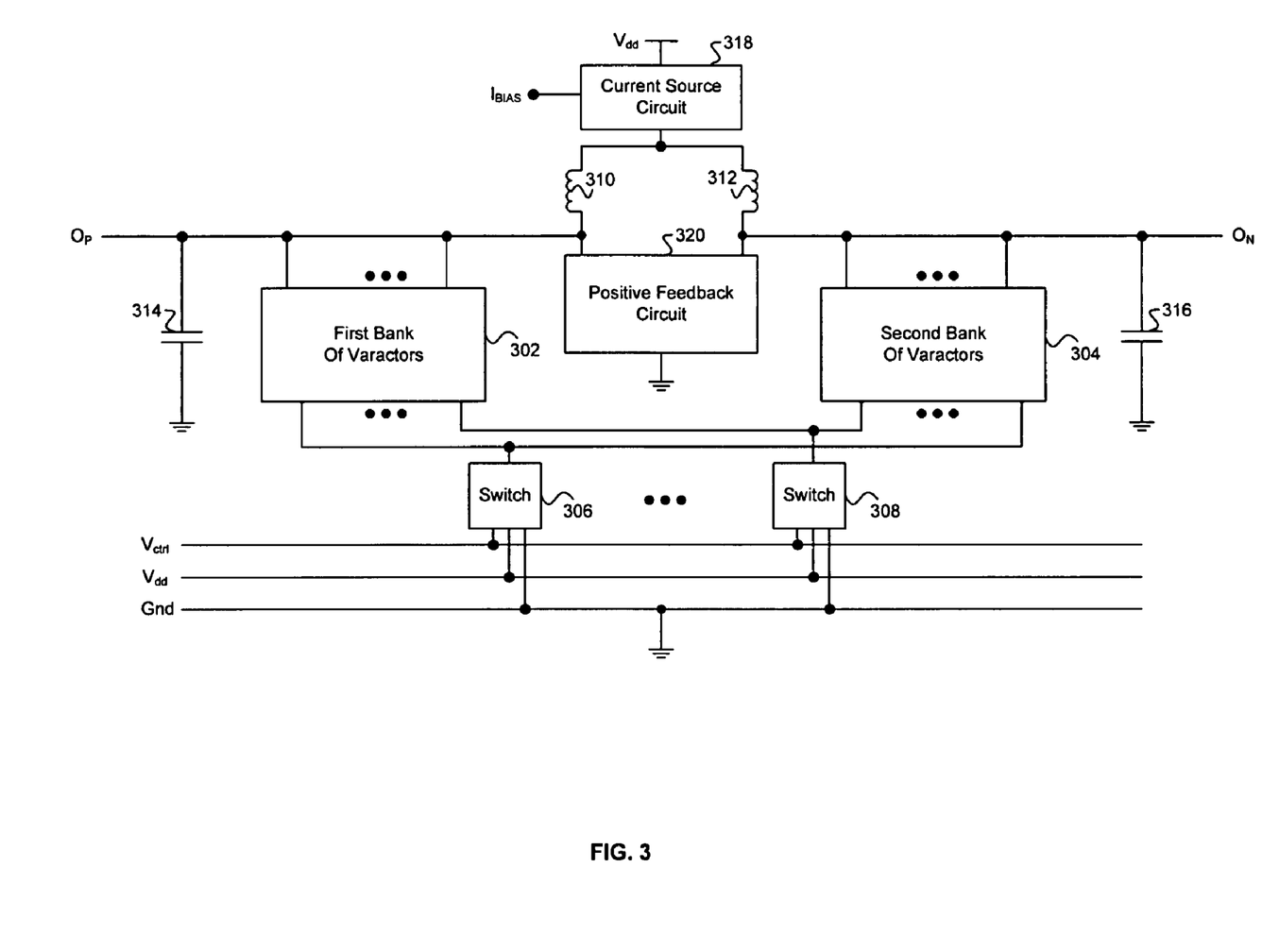
FIG. 3 is a block diagram of an exemplary system for VCO with switchable varactor for low KVCO variation, in accordance with an embodiment of the invention.

FIG. 3 is a block diagram of an exemplary system for VCO with switchable varactor for low KVCO variation, in accordance with an embodiment of the invention. With reference to FIG. 3, there is shown a first bank of varactors 302, a second bank of varactors 304, a plurality of switches 306 . . . 308, a plurality of inductors 310 and 312, a plurality of load capacitors 314 and 316, a current source circuit 318, and a positive feedback circuit 320. Also shown in FIG. 3 is a bias current input signal, $I_{bias}$, the time varying signals, $O_P$ and $O_N$, a control voltage $V_{cntl}$, a supply voltage $V_{dd}$, and a ground reference voltage gnd. The ground reference voltage may also be referred to as a ground reference, or ground.

The first bank of varactors 302 and the second bank of varactors 304 may each comprise a plurality of varactors. Each varactor in the first bank of varactors 302 may be coupled to a corresponding varactor in the second bank of varactors 304, such that, for example, the first varactor in the first bank of varactors 302 may be coupled to the first varactor in the second bank of varactors 304, and so forth. Each coupled pair of varactors in the first bank of varactors 302 and the second bank of varactors 304 may be coupled to a switch from the plurality of switches 306 . . . 308. Each switch from the plurality of switches 306 . . . 308 may be coupled to a control voltage $V_{cntl}$, a supply voltage $V_{dd}$, and a ground reference voltage gnd.

Each varactor in the first bank of varactors 302 may be coupled to an inductor 310, to a load capacitor 314, and to a terminal of a positive feedback circuit 320. Each varactor in the second bank of varactors 304 may be coupled to an inductor 312, to a load capacitor 316, and to a different terminal of a positive feedback circuit 320 from the terminal on the positive feedback circuit 320 to which the first bank of varactors may be coupled. The load capacitors 314 and 316 may be coupled to the ground reference voltage gnd. Each of the inductors 310 and 312 may be coupled to a current source circuit 318. The current source circuit 318 may be coupled to a bias current input signal, $I_{bias}$, and to the supply voltage $V_{dd}$.

Figure 4:
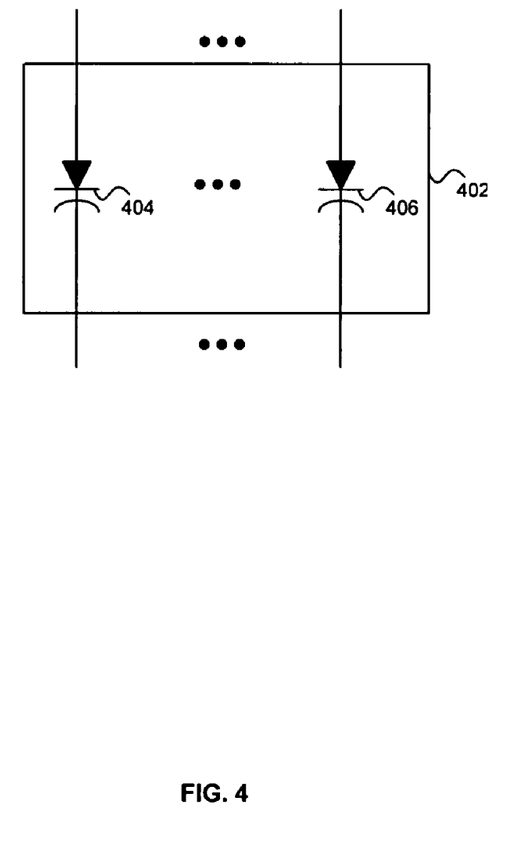
FIG. 4 is a diagram of an exemplary bank of varactors, which may be utilized in connection with an embodiment of the invention.

FIG. 4 is a diagram of an exemplary bank of varactors, which may be utilized in connection with an embodiment of the invention. With reference to FIG. 4, there is shown a bank of varactors 402. The bank of varactors 402 may comprise a plurality of varactors 404 . . . 406. Various embodiments of the invention may implement a varactor in the plurality of varactors 404 . . . 406 utilizing a variety of devices. A varactor in the plurality of varactors 402 may, for example, be implemented utilizing a diode. Alternatively, a varactor in the plurality of varactors 402 may be implemented utilizing a metal oxide semiconductor field effect device (MOSFET).

Figure 5A:
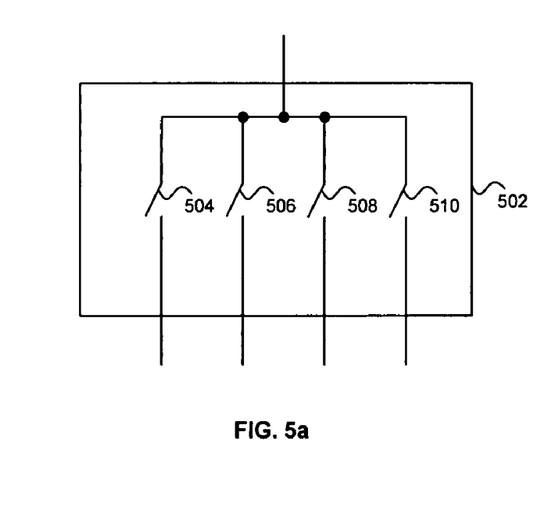
FIG. 5a is a diagram of an exemplary switch implemented as a plurality of single pole switches, which may be utilized in connection with an embodiment of the invention.

FIG. 5a is a diagram of an exemplary switch implemented as a plurality of single pole switches, which may be utilized in connection with an embodiment of the invention. With reference to FIG. 5a, there is shown a switch 502. The switch 502 may comprise a plurality of single pole switches 504, 506, 508, and 510. Individually, each of the single pole switches 504, 506, 508, and 510 may couple a single input to a single output. A single pole switch 504 may be coupled to each of the single pole switches 506, 508, and 510. When the plurality of single pole switches 504, 506, 508, and 510 are coupled as shown in FIG. 5a, the switch 502 may couple a single input to one of a plurality of outputs, or the switch 502 may couple a single output to one of a plurality of inputs.

Figure 5B:
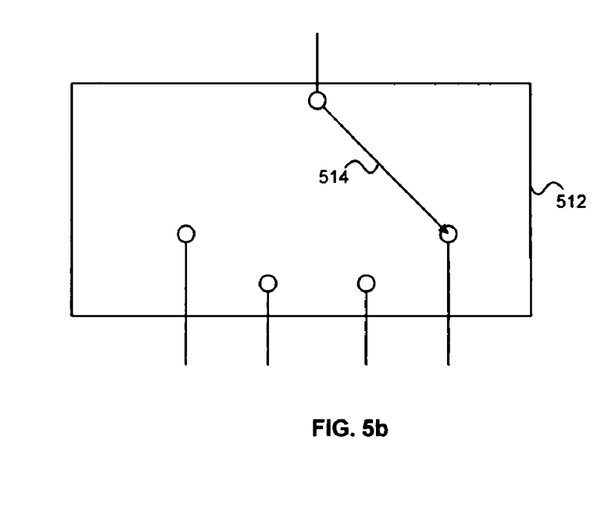
FIG. 5b is a diagram of an exemplary switch implemented as a multi-pole switch, which may be utilized in connection with an embodiment of the invention.

FIG. 5b is a diagram of an exemplary switch implemented as a multi-pole switch, which may be utilized in connection with an embodiment of the invention. With reference to FIG. 5b, there is shown a switch 512. The switch 512 may comprise a multi-pole pole switch 514. The multi-pole switch 514 may couple a single input to one of a plurality of outputs, or the multi-pole switch 514 may couple a single output to one of a plurality of inputs. Various embodiments of the invention may utilize a switch that comprises aspects of 502 or 512.

Figure 6:
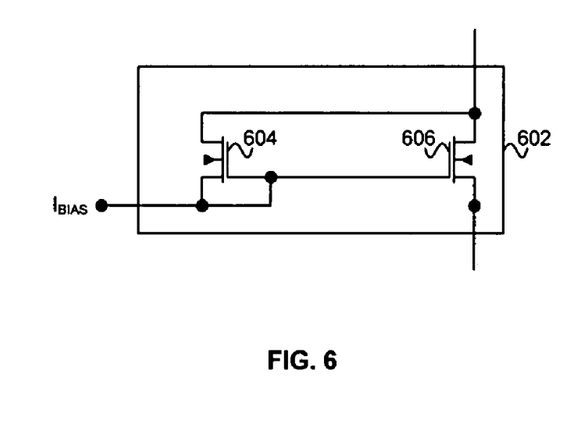
FIG. 6 is an exemplary current source circuit design, which may be utilized in connection with an embodiment of the invention.

FIG. 6 is an exemplary current source circuit design, which may be utilized in connection with an embodiment of the invention. With reference to FIG. 6, there is shown a current source circuit 602. The current source circuit 602 may comprise p-channel MOSFETs 604, and 606. Also shown in FIG. 6, is a bias current input signal, $I_{bias}$. A MOSFET may also be referred to as an FET, or transistor.

In operation, a bias current input signal, $I_{bias}$, may be supplied to the drain terminal, or drain, of the transistor 604. Associated with the bias current input signal, $I_{bias}$, is a bias voltage, $V_{bias}$, which may be applied to the gate terminal, or gate, of the transistor 604. The difference between the voltage applied between the gate of a transistor, and the voltage applied to the source terminal, of the source, of the same transistor, may be referred to as the gate to source voltage, $v_{gs}$. The drain current of a transistor, $i_d$, such as, for example transistor 604, may be proportional to the gate to source voltage, $v_{gs}$.

The current source circuit 602 may be referred to as a current mirror in that the value of the gate to source voltage $v_{gs}$ that is applied to transistor 604 may also equal the value of $v_{gs}$ that is applied to transistor 606. Therefore, a percentage change in the current $i_d$ for transistor 604 may produce a comparable percentage change in the current $i_d$ for transistor 606. The actual value of the change in $i_d$ for transistor 604 may not equal the actual value of the change $i_d$ in for transistor 606. One reason may be that the value of the transconductance $g_m$ for transistor 604 may not equal the value of the transconductance $g_m$ for transistor 606.

Figure 7:
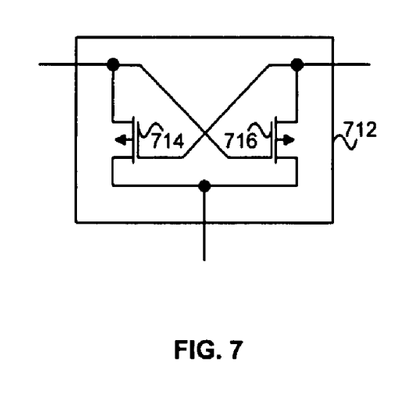
FIG. 7 is an exemplary positive feedback circuit design, which may be utilized in connection with an embodiment of the invention.

FIG. 7 is an exemplary positive feedback circuit design, which may be utilized in connection with an embodiment of the invention. With reference to FIG. 7, there is shown a positive feedback circuit 712. The positive feedback circuit 712 may comprise n-channel transistors 714, and 716.

In operation, a voltage at the drain of transistor 714 may be applied to the gate of transistor 716. A voltage at the drain of transistor 716 may be applied to the gate of transistor 714. The voltage at the source of transistor 714 may be equal to the voltage at the source of transistor 716. The impedance coupled to the drain of transistor 714 may be referred to as $Z_{714}(s)$, where the impedance $Z_{714}(s)$ may vary based on the oscillating frequency, s, of the signal applied at the drain of transistor 714. The impedance coupled to the drain of transistor 716 may be referred to as the impedance $Z_{716}(s)$, where $Z_{716}(s)$ may vary based on the oscillating frequency, s, of the signal applied at the drain of transistor 716.

The positive feedback in the positive feedback circuit 712 may result in a decrease of the voltage at the drain of a transistor, such as, for example, transistor 714, leading to a further decrease in the same voltage based on the feedback in the positive feedback circuit 712. Conversely, an increase in the voltage at the drain of a transistor may lead to a further increase in the same voltage based on the feedback mechanism in the positive feedback circuit 712.

Figure 8:
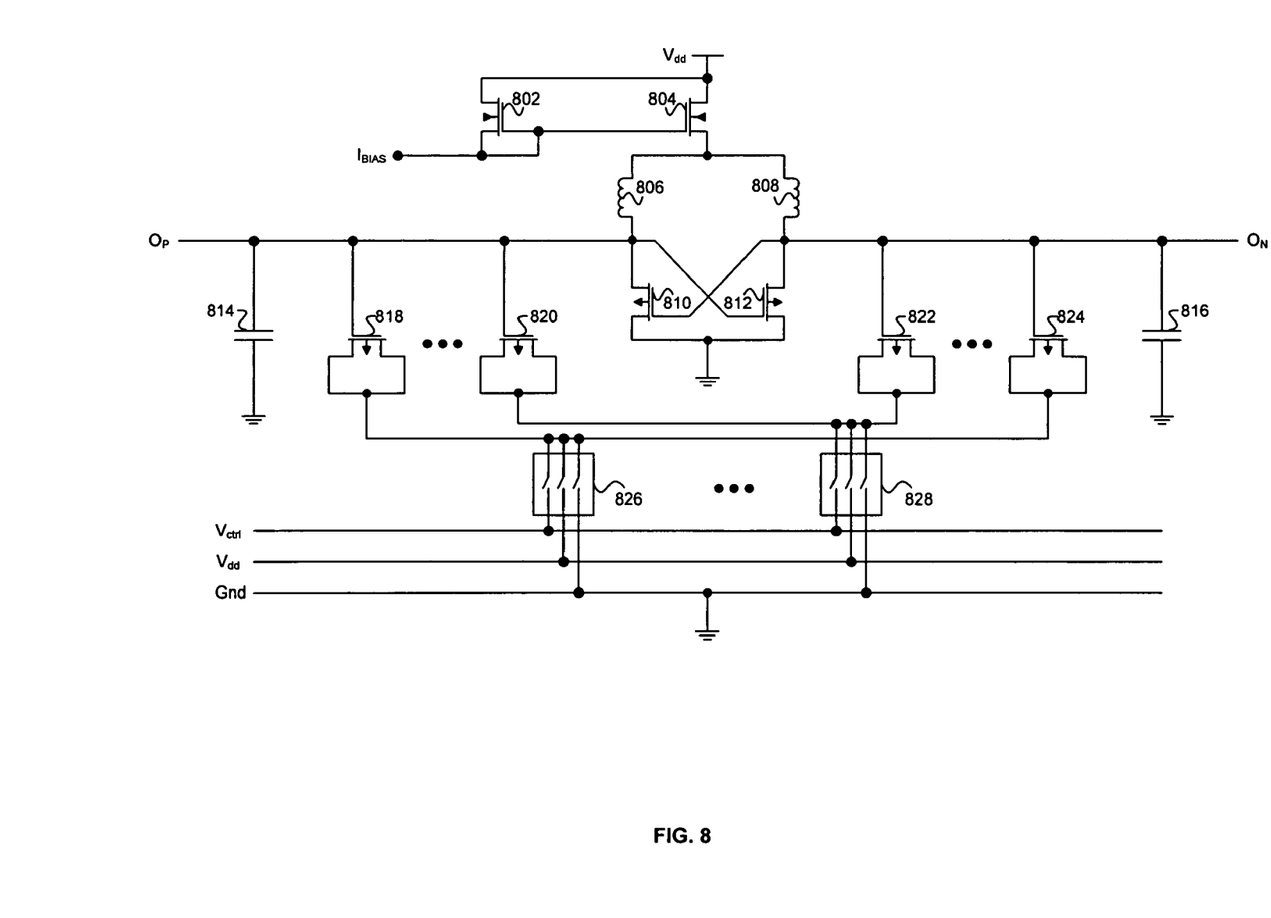
FIG. 8 is an exemplary circuit design for a VCO with switchable varactor for low KVCO variation, in accordance with an embodiment of the invention.

FIG. 8 is an exemplary circuit design for a VCO with switchable varactor for low KVCO variation, in accordance with an embodiment of the invention. With reference to FIG. 8, there are shown p-channel transistors 802 and 804, inductors 806 and 808, n-channel transistors 810 and 812, load capacitors 814 and 816, a plurality of varactors 818 . . . 820, and 822 . . . 824, and a plurality of switches 826 . . . 828. The plurality of varactors 818 . . . 820 may comprise a first bank of varactors, and the plurality of varactors 822 . . . 824 may comprise a second bank of varactors. The transistors 802 and 804 may be components in a current source circuit 602. The transistors 810 and 812 may be components in a positive feedback circuit 712. Also shown in FIG. 8 is a bias current input signal, $I_{bias}$, the time varying signals, $O_P$ and $O_N$, a control voltage $V_{cntl}$, a supply voltage $V_{dd}$, and a ground reference voltage gnd.

A varactor in the plurality of varactors 818 . . . 820, and 822 . . . 824 may be implemented as an n-channel MOSFET, or NMOS transistor, for which the drain is coupled to the source. The capacitance of a varactor, $C_{var}$, in the plurality 818 . . . 820 may be based on the difference in the voltage level of the time varying signal, $O_P$, applied to the gate of a varactor in the plurality 818 . . . 820, and the voltage level coupled to the drain and source of the same varactor in the plurality 818 . . . 820 via a corresponding switch in the plurality of switches 826 . . . 828. The capacitance of a varactor in the plurality 822 . . . 824 may be based on the difference in the voltage level of the time varying signal, $O_N$, applied to the gate of a varactor in the plurality 822 . . . 824, and the voltage level coupled to the drain and source of the same varactor in the plurality 822 . . . 824 via a corresponding switch in the plurality of switches 826 . . . 828.

When the voltage level of the time varying signal, $O_P$, coupled to the gate of a varactor, implemented as an NMOS transistor, in the plurality of varactors 818 . . . 820 is greater than the sum of the gate to source threshold voltage level, and the voltage level coupled to the source and drain of the same varactor, the capacitance of that varactor may reach a maximum capacitive value $C_{max}$. When the voltage level of the time varying signal, $O_P$, coupled to the gate of a varactor, implemented as an NMOS transistor, in the plurality of varactors 818 . . . 820 is not greater than the sum of the gate to source threshold voltage level, and the voltage level coupled to the source and drain of the same varactor, the capacitance of that varactor may reach a minimum capacitive value $C_{min}$. In an exemplary normal NMOS transistor, the gate to source threshold voltage level may approximately equal 600 millivolts. In an exemplary accumulation type NMOS transistor, the gate to source threshold voltage level may approximately equal 0 volts.

The average value of the capacitance of a varactor implemented as an NMOS transistor, $Avg(C_{var})$, may increase as the proportion of time increases during which the time varying signal $O_P$ is greater than the sum of the gate to source threshold voltage level, and the voltage level coupled to the source and drain of the same varactor. Therefore, if the voltage level of $V_{dd}$ is greater than the voltage levels of the control voltage $V_{cntl}$ and gnd, and if the voltage level of $V_{cntl}$ is greater than the voltage level of the ground, gnd:

$$Avg(C_{var}(gnd)) > Avg(C_{var}(V_{cntl})) > Avg(C_{avg}(V_{dd})) \qquad \text{equation [4]}$$

where $Avg(C_{var}(V_{dd}))$ may represent the average value of the capacitance of a varactor when the drain and source are coupled to the supply voltage $V_{dd}$, $Avg(C_{var}(V_{cntl}))$ may represent the average value of the capacitance of a varactor when the drain and source are coupled to the control voltage $V_{cntl}$, and $Avg(C_{var}(gnd))$ may represent the average value of the capacitance of a varactor when the drain and source are coupled to the ground, gnd. If the voltage level of $V_{dd}$ is greater than the voltage level of the amplitude of the time varying signal $O_P$, then the $Avg(C_{var}(V_{dd}))$ may be equal to the minimum capacitance $C_{min}$. If the voltage level of the amplitude of the time varying signal $O_P$ is greater than gnd, then $Avg(C_{var}(gnd))$ may be equal to the maximum capacitance $C_{max}$.

If the voltage level of the amplitude of the time varying signal $O_P$ is small, then the $Avg(C_{var}(V_{cntl}))$ may be more sensitive to small changes in $V_{cntl}$ because small changes in the control voltage $V_{cntl}$ may result in large changes in the portion of time during which $O_P$ is greater than the sum of the gate to source threshold voltage level, and the voltage level of the control voltage $V_{cntl}$. If the voltage level of the amplitude of the time varying signal $O_P$ is large, then the $\text{Avg}(C_{var}(V_{cntl}))$ may be less sensitive to small changes in the control voltage $V_{cntl}$ because small changes in $V_{cntl}$ may not result in large changes in the portion of time during which $O_P$ is greater than the sum of the gate to source threshold voltage level, and the voltage level of the control voltage $V_{cntl}$.

The value of the total capacitance, $C_{tot,P}$, for the half of the voltage controlled oscillator (VCO) comprising the second bank of varactors 818 ... 820 may be represented by:

$$C_{tot,P} = C_{load} + iC_{min} + jC_{max} + k\text{Avg}(C_{var}(V_{cntl})) \quad \text{equation [5]}$$

where i may represent the number of varactors among the plurality of varactors 818 ... 820 that are coupled to the supply voltage $V_{dd}$, j may represent the number of varactors among the plurality of varactors 818 ... 820 that are coupled to the ground, gnd, and k may represent the number of varactors among the plurality of varactors 818 ... 820 that are coupled to the control voltage $V_{cntl}$. $C_{load}$ may represent the capacitance of the load capacitor 814. Among the components of $C_{tot,P}$ in equation [5], the value of $C_{var}(V_{cntl})$ may vary based on the control voltage $V_{cntl}$.

When the voltage level of the time varying signal, $O_N$, coupled to the gate of a varactor implemented as an NMOS transistor in the plurality of varactors 822 ... 824 is greater than the sum of the gate to source threshold voltage level, and the voltage level coupled to the source and drain of the same varactor, the capacitance of that varactor may reach a maximum capacitive value $C_{max}$. When the voltage level of the time varying signal, $O_N$, coupled to the gate of a varactor in the plurality of varactors 822 ... 824 is not greater than the sum of the gate to source threshold voltage level, and the voltage level coupled to the source and drain of the same varactor, the capacitance of that varactor may reach a minimum capacitive value $C_{min}$.

The average value of the capacitance of a varactor implemented as an NMOS transistor, $\text{Avg}(C_{var})$, may increase as the proportion of time increases during which the time varying signal $O_N$ is greater than the sum of the gate to source threshold voltage level, and the voltage level coupled to the source and drain. Therefore, if the voltage level of $V_{dd}$ is greater than the voltage levels of $V_{cntl}$ and gnd, and if the control voltage $V_{cntl}$ is greater than the voltage level of the ground, gnd, the relationship between $\text{Avg}(C_{var}(V_{dd}))$, $\text{Avg}(C_{var}(V_{cntl}))$, and $\text{Avg}(C_{var}(\text{gnd}))$ may be as expressed in equation [4]. If the voltage level of the supply voltage $V_{dd}$ is greater than the voltage level of the amplitude of the time varying signal $O_N$, then the $\text{Avg}(C_{var}(V_{dd}))$ may be equal to the minimum capacitance $C_{min}$. If the voltage level of the amplitude of the time varying signal $O_N$ is greater than ground, gnd, then $\text{Avg}(C_{var}(\text{gnd}))$ may be equal to the maximum capacitance $C_{max}$.

If the voltage level of the amplitude of the time varying signal $O_N$ is small, then the $\text{Avg}(C_{var}(V_{cntl}))$ may be more sensitive to small changes in the control voltage $V_{cntl}$ because small changes in $V_{cntl}$ may result in large changes in the portion of time during which $O_N$ is greater than the sum of the gate to source threshold voltage level, and the voltage level of the control voltage $V_{cntl}$. If the voltage level of the amplitude of the time varying signal $O_N$ is large, then the $\text{Avg}(C_{var}(V_{cntl}))$ may be less sensitive to small changes in the control voltage $V_{cntl}$ because small changes in $V_{cntl}$ may not result in large changes in the portion of time during which $O_N$ is greater than the sum of the gate to source threshold voltage level, and the voltage level of the control voltage $V_{cntl}$.

The value of the total capacitance, $C_{tot,N}$, for the half of the voltage controlled oscillator (VCO) comprising the second bank of varactors 822 ... 824 may be represented by:

$$C_{tot,N} = C_{load} + lC_{min} + mC_{max} + n\text{Avg}(C_{var}(V_{cntl})) \quad \text{equation [6]}$$

where l may represent the number of varactors among the plurality of varactors 822 ... 824 that are coupled to the supply voltage $V_{dd}$, m may represent the number of varactors among the plurality of varactors 822 ... 824 that are coupled to the ground, gnd, and n may represent the number of varactors among the plurality of varactors 822 ... 824 that are coupled to the control voltage $V_{cntl}$. $C_{load}$ may represent the capacitance of the load capacitor 816. Among the components of $C_{tot,N}$ in equation [6], the value of $C_{var}(V_{cntl})$ may vary based on the control voltage $V_{cntl}$.

In addition to voltage, value of the capacitance of the varactor, $C_{var}$, may depend upon other factors. The amount of capacitance of a varactor when implemented utilizing a MOSFET may be based on the physical geometry of the transistor. Manufacturing, or operating temperature variations among varactors, and $C_{ox}$ variations, may result in variations in the value of the capacitance among the plurality of varactors 818 ... 820, and 822 ... 824. Differences in threshold voltages among the varactors may also result in variations in the value of the capacitance among the plurality of varactors 818 ... 820, and 822 ... 824.

The inductors 806 and 808, the load capacitors 814 and 816, and the first and second banks of varactors 818 ... 820 and 822 ... 824, may comprise a tank which may implement a bandpass filter. The current source circuit, comprising transistors 802 and 804, may supply energy to the tank that generates time varying signals $O_P$ and $O_N$ with an oscillating frequency $F_{osc}$ that may be expressed as:

$$F_{osc} = \frac{2\pi}{\sqrt{L_{tot}C_{tot}}} \quad \text{equation [7]}$$

where $L_{tot}$ may represent the total inductance value of the inductors 806 and 808, and $C_{tot}$ may represent the sum of the capacitance values of the load capacitor 814 and 816, and of each varactor in the first and second banks of varactors 818 ... 820 and 822 ... 824, as expressed in equations [5] and [6]. The total inductance value $L_{tot}$ may be expressed as:

$$L_{tot} = L_{806} + L_{808} \quad \text{equation [8]}$$

where $L_{806}$ may represent the inductance value of the inductor 806, and $L_{808}$ may represent the inductance value of the inductor 808. The total capacitance value $C_{tot}$ may be expressed as:

$$C_{tot} = \frac{C_{tot,N} C_{tot,P}}{C_{tot,N} + C_{tot,P}} \quad \text{equation [9]}$$

where $C_{tot,P}$ may represent the capacitance of the first bank of varactors as expressed in equation [5], and $C_{tot,N}$ may represent the capacitance of the second bank of varactors as expressed in equation [6]. For the capacitance value of $C_{tot,P}$ approximately equal to the capacitance value of $C_{tot,N}$, the capacitance value of $C_{tot}$ may be approximately equal to $\frac{1}{2}C_{tot,P}$, or $\frac{1}{2}C_{tot,N}$.

The oscillating frequency, $F_{osc}$, may represent the center frequency in the pass band of the bandpass filter implemented by the tank. The value of the center frequency divided by the bandwidth of the bandpass filter may represent the Q factor, or Q, of the tank. The Q factor for the tank may be expressed as:

$$Q = \frac{2\pi F_{osc} L}{R_s} \quad \text{equation [10]}$$

where $R_s$ may represent the parasitic resistance associated with the inductors 806 and 808.

The parasitic resistance, $R_s$, may dissipate the energy of the time varying signals $O_P$ and $O_N$, with an oscillating frequency, $F_{osc}$, that may be generated in the tank. The positive feedback circuit, comprising transistors 810 and 812, may supply energy that reinforces the frequency oscillation in the tank. As a result, the tank may be able to sustain the time varying signals $O_P$ and $O_N$ with an oscillating frequency $F_{osc}$.

The value of Q may influence the amplitude of the time varying signals $O_P$ and $O_N$. A change in the bias current supplied by the current source circuit may increase the amount of energy to support frequency oscillation in the tank. This may also change the amplitude of the time varying signals $O_P$ and $O_N$. A change in the amplitude of the time varying signals $O_P$ and $O_N$ may produce a change the value KVCO. Because the oscillating frequency, $F_{osc}$, may be dependent on $C_{tot}$, the factors which may result in variations in the capacitance of a varactor in the first and second banks of varactors 818 . . . 820, and 822 . . . 824, may also change the oscillating frequency, $F_{osc}$, of the time varying signals $O_P$ and $O_N$, which are output from the voltage controlled oscillator (VCO).

A switch among the plurality of switches 826 . . . 828 may couple a corresponding varactor in the plurality of varactors 818 . . . 820, and a corresponding varactor in the plurality of varactors 822 . . . 824, to a supply voltage, $V_{dd}$, a control voltage, $V_{cntl}$, or a ground voltage, gnd. The level of capacitance in varactors that are coupled to $V_{dd}$ or gnd voltage levels in the first bank of varactors, and in the second bank of varactors may not vary based on changes in the control voltage $V_{cntl}$. The level of capacitance in varactors that are coupled to the control voltage $V_{cntl}$ in the first bank of varactors, and in the second bank of varactors may vary based on changes in $V_{cntl}$. As the number of varactors coupled to the control voltage $V_{cntl}$ is increased, a greater portion of the total capacitance in the tank, $C_{tot}$, may vary based on $V_{cntl}$. This, in turn, may result in the oscillating frequency for the tank, $F_{osc}$, changing more rapidly for a given change in the control voltage $V_{cntl}$. According to equation [2], the change in an oscillating frequency based on a change in $V_{cntl}$ may be defined as the rate of change in the oscillating frequency, which may be represented by KVCO. Thus, by utilizing the switches in the plurality of switches 826 . . . 828, to couple varactors to the control voltage $V_{cntl}$ in the first bank of varactors 818 . . . 820, and in the second bank of varactors 822 . . . 824, the value of KVCO may be tuned.

Similarly, the value of total capacitance in the tank $C_{tot}$ may be tuned to compensate for other variations that may affect KVCO such as, for example, $C_{ox}$ variation, threshold voltage variation, inductance value variation in the inductors 806 and 808, and operating temperature variation. Each switch in the plurality of switches 826 . . . 828 may be controlled utilizing a plurality of binary bits. The binary value of the plurality of binary bits may be based on a varactor control code. For example, for variations that result in an increase in $C_{tot}$, the switches in the plurality of switches 826 . . . 828 may be controlled such that the number of varactors in the first and second banks of varactors, 818 . . . 820 and 822 . . . 824, which are coupled to the ground voltage, gnd, may be decreased, and the number of varactors in the first and second banks of varactors, 818 . . . 820 and 822 . . . 824, which are coupled to the supply voltage, $V_{dd}$, may be increased. With reference to equations [5] and [6], i and l may be decreased and j and m may be increased. As a result, the oscillating frequency, $F_{osc}$ of the time varying signals $O_P$ and $O_N$ from the tank of the VCO may be controlled.

For variations that result in a decrease in the total capacitance in the tank, $C_{tot}$, the switches in the plurality of switches 826 . . . 828 may be controlled such that the number of varactors, in the first and second banks of varactors, 818 . . . 820 and 822 . . . 824, which are coupled to the ground voltage, gnd, may be increased, and the number of varactors, in the first and second banks of varactors 818 . . . 820 and 822 . . . 824, which are coupled to $V_{dd}$ may be decreased. With reference to equations [5] and [6], i and l may be increased and j and m may be decreased. As a result, the oscillating frequency, $F_{osc}$ of the time varying signals, $O_P$ and $O_N$, from the tank of the VCO may be controlled.

Figure 9:
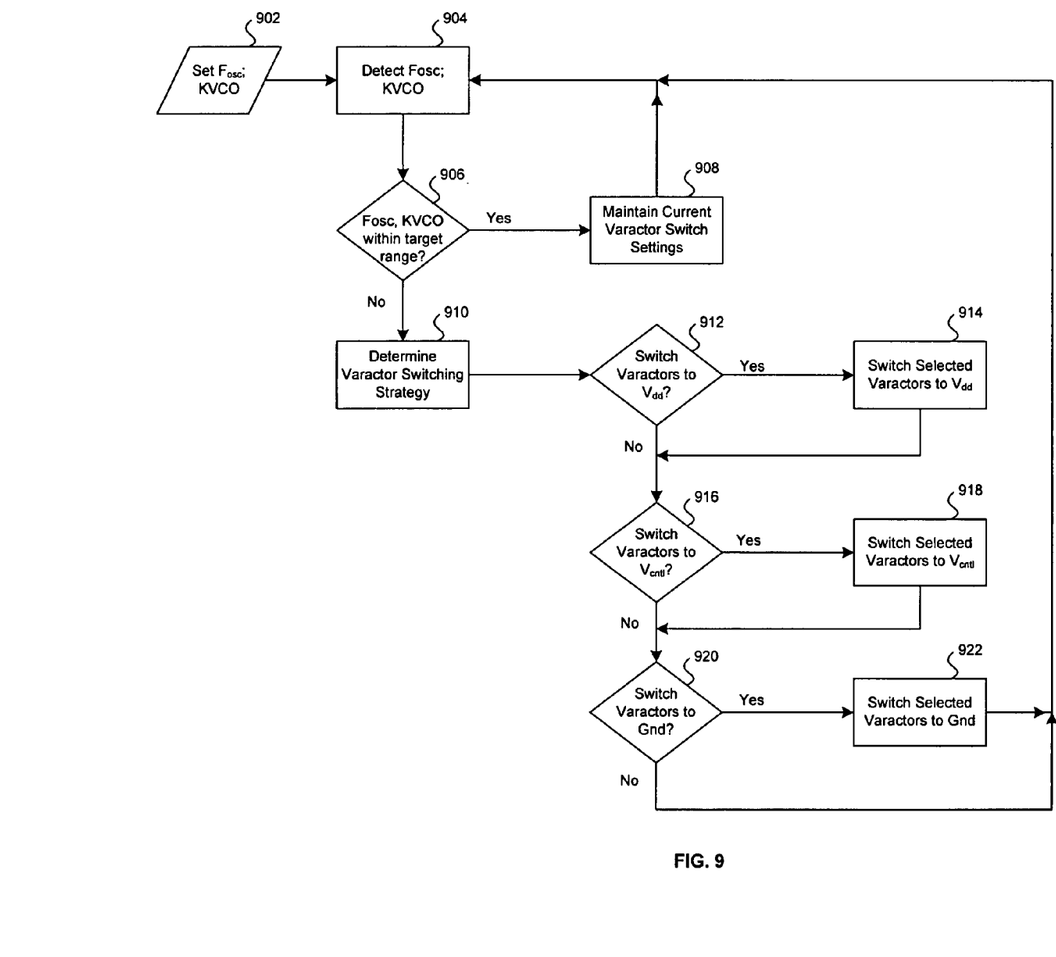
FIG. 9 is a flow chart illustrating an exemplary method for switching varactors in a VCI with switchable varactor for low KVCO variation, in accordance with an embodiment of the invention.

FIG. 9 is a flow chart illustrating an exemplary method for switching varactors in a VCO with switchable varactor for low KVCO variation, in accordance with an embodiment of the invention. With reference to FIG. 9, in step 902, values for the oscillating frequency $F_{osc}$, and KVCO may be set. In step 904, the oscillating frequency $F_{osc}$ and KVCO for a VCO 112 may be detected. In step 906, the detected $F_{osc}$ and KVCO from step 904 may be evaluated to determine if they are within a target range determined in step 902. If $F_{osc}$ and KVCO are within range, the current varactor switch settings may be maintained.

In step 910, a varactor switching strategy may be determined if $F_{osc}$ and KVCO are not within the target range in step 906. Step 912 may determine if any varactors are to be coupled to the supply voltage, $V_{dd}$. Step 914 may couple the selected varactors to $V_{dd}$ if step 912 determined that varactors are to be coupled to $V_{dd}$ that were not previously coupled to $V_{dd}$. Step 916 may determine if any varactors are to be coupled to the control voltage, $V_{cntl}$. Step 918 may couple the selected varactors to $V_{cntl}$, if step 916 determined that varactors are to be coupled to $V_{cntl}$ that were not previously coupled to $V_{cntl}$. Step 920 may determine if any varactors are to be coupled to the ground voltage, gnd. Step 922 may couple the selected varactors to gnd if step 920 determined that varactors are to be coupled to gnd that were not previously coupled to gnd.

Figure 10:
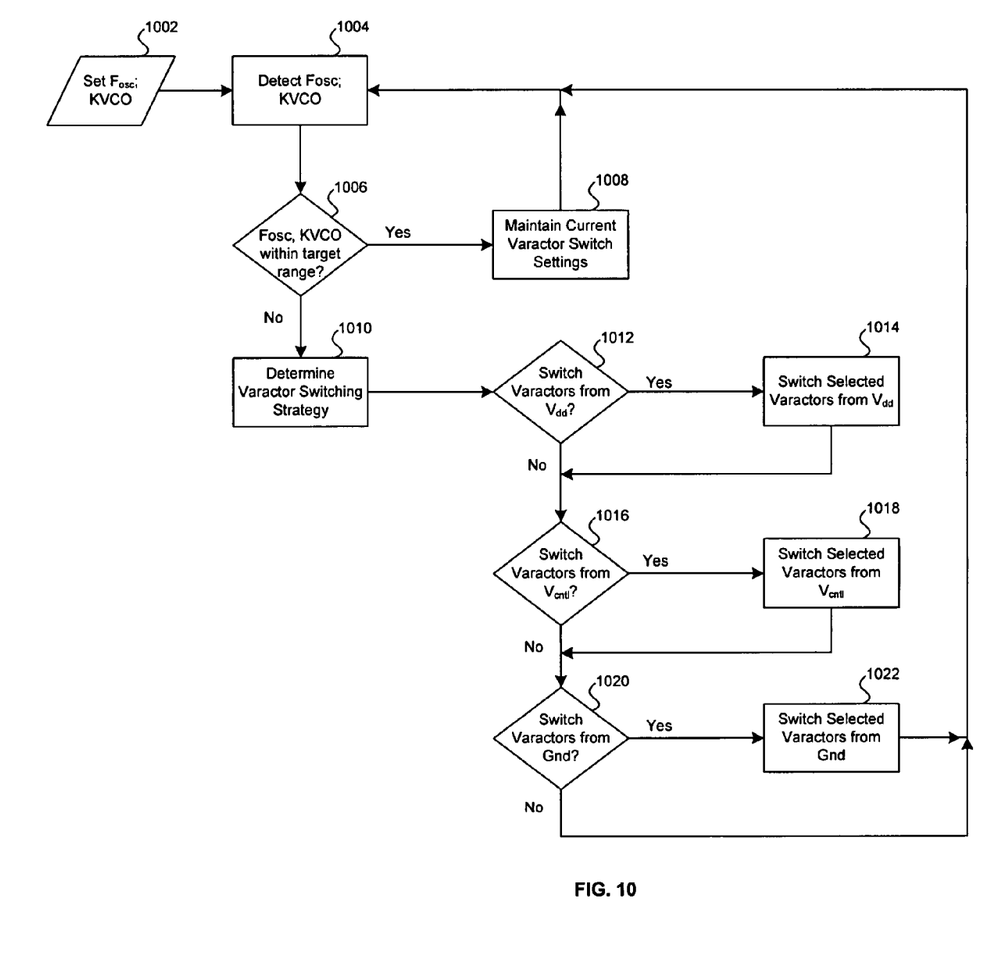
FIG. 10 is a flow chart illustrating an exemplary method for unswitching varactors in a VCI with switchable varactor for low KVCO variation, in accordance with an embodiment of the invention.

FIG. 10 is a flow chart illustrating an exemplary method for unswitching varactors in a VCO with switchable varactor for low KVCO variation, in accordance with an embodiment of the invention. With reference to FIG. 10, in step 1002, values for the oscillating frequency $F_{osc}$, and KVCO may be set. In step 1004, the oscillating frequency $F_{osc}$ and KVCO for a VCO 112 may be detected. In step 1006, the detected $F_{osc}$ and KVCO from step 1004 may be evaluated to determine if they are within a target range determined in step 1002. If $F_{osc}$ and KVCO are within range, the current varactor switch settings may be maintained.

In step 1010, a varactor switching strategy may be determined if $F_{osc}$ and KVCO are not within the target range in step 1006. Step 1012 may determine if any varactors are to be decoupled from the supply voltage, $V_{dd}$. Step 1014 may decouple the selected varactors from $V_{dd}$ if step 1012 determined that varactors are to be decoupled from $V_{dd}$ that were previously coupled to $V_{dd}$. Step 1016 may determine if any varactors are to be decoupled from the control voltage, $V_{cntl}$. Step 1018 may decouple the selected varactors from $V_{cntl}$ if step 1016 determined that varactors are to be decoupled from $V_{cntl}$ that were previously coupled to $V_{cntl}$. Step 1020 may determine if any varactors are to be decoupled from the ground voltage, gnd. Step 1022 may decouple the selected varactors from gnd if step 1020 determined that varactors are to be decoupled from gnd that were previously coupled to gnd.

Various embodiments of the invention may provide a method and system for a voltage controlled oscillator (VCO) with switchable varactors for low KVCO variation. In various embodiments of the invention, a total capacitance in a circuit may be modified to compensate for variations in VCO circuitry based on the switching of varactors. As a result, a change in KVCO may be minimized. Since KVCO may represent the change in the oscillating frequency of the VCO based on the change in a control voltage, minimizing the change in KVCO may minimize the variation of the phase locked loop bandwidth. Minimizing the change in KVCO may enable the oscillating frequency to be generated more predictably based on the level of a control voltage than may be the case in some conventional VCO circuit designs. Adapting the value of the capacitance in a VCO by switching a plurality of varactors may also control the oscillating frequency of the time varying signal generated by the VCO, in addition to controlling a change in the oscillating frequency that may result from variations in the VCO circuitry.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling a signal, the method comprising:
    configuring at least one varactor of a plurality of varactors by selecting a voltage level from a plurality of voltage references comprising a supply voltage, a control voltage, and a ground reference voltage;
    controlling an oscillating frequency of a time varying signal in a circuit based on said configuring; and
    controlling a rate of change in said oscillating frequency based on said configuring.

2. The method according to claim 1, wherein said switching of said plurality of varactors controls a change in said oscillating frequency based on a control voltage.

3. The method according to claim 1, comprising minimizing a change in said rate of change in said oscillating frequency due to an amplitude of said time varying signal based on said switching of said plurality of varactors.

4. The method according to claim 1, comprising minimizing a change in said oscillating frequency by adjusting a value for KVCO based on said switching of said plurality of varactors.

5. The method according to claim 1, comprising controlling said change of said time varying signal based on a control voltage.

6. The method according to claim 1, comprising controlling a capacitance in said circuit based on said switching of said plurality of varactors.

7. A machine-readable storage having stored thereon, a computer program having at least one code section for controlling a signal, the at least one code section being executable by a machine for causing the machine to perform steps comprising:
    configuring at least one varactor of a plurality of varactors by selecting a voltage level from a plurality of voltage references comprising a supply voltage, a control voltage, and a ground reference voltage;
    controlling an oscillating frequency of a time varying signal in a circuit based on said configuring; and
    controlling a rate of change in said oscillating frequency based on said configuring.

8. The machine-readable storage according to claim 7, comprising code for minimizing a change in said rate of change in said oscillating frequency due to an amplitude of said time varying signal based on said switching of said plurality of varactors.

9. The machine-readable storage according to claim 7, comprising code for minimizing a change in said oscillating frequency by adjusting a value for KVCO based on said switching of said plurality of varactors.

10. The machine-readable storage according to claim 7, comprising code for controlling said change of said time varying signal based on a control voltage.

11. The machine-readable storage according to claim 7, comprising code for controlling a capacitance in said circuit based on said switching of said plurality of varactors.

12. A system for controlling a signal, the system comprising:
    circuitry that configures at least one varactor of a plurality of varactors by selecting a voltage level from a plurality of voltage references comprising a supply voltage, a control voltage, and a ground reference voltage;
    said circuitry controls an oscillating frequency of a time varying signal in a circuit based on said configuring; and
    said circuitry controls a rate of change in said oscillating frequency based on said configuring.

13. The system according to claim 12, wherein said switching of said plurality of varactors controls a change in said oscillating frequency based on a control voltage.

14. The system according to claim 12, wherein said circuitry minimizes a change in said rate of change in said oscillating frequency due to an amplitude of said time varying signal based on said switching of said plurality of varactors.

15. The system according to claim 12, wherein said circuitry minimizes a change in said oscillating frequency by adjusting a value for KVCO based on said switching of said plurality of varactors.

16. The system according to claim 12, wherein said circuitry controls said change of said time varying signal based on a control voltage.

17. The system according to claim 12, wherein said circuitry controls a capacitance in said circuit based on said switching of said plurality of varactors.

18. The system according to claim 12, wherein said control voltage comprises a range of voltage levels.

19. The system according to claim 18, wherein said range of voltage levels comprises 0 volts to 3 volts.

20. A system for controlling a signal, the system comprising:
    a first bank of varactors comprising a first plurality of varactors;
    a second bank of varactors comprising a second plurality of varactors wherein each varactor in said second bank is coupled to a corresponding one of said first plurality of varactors in said first bank of varactors;
    a first of a plurality of switches through which a corresponding first varactor in said first bank of varactors and a corresponding first varactor in said second bank of varactors are coupled to one of a plurality of voltage references comprising a supply voltage, a control voltage, and a ground reference voltage; and
    a subsequent one of said plurality of switches through which a corresponding subsequent varactor in said first bank of varactors and a corresponding subsequent varactor in said second bank of varactors are coupled to one of said plurality of voltage references.

21. The system according to claim 20, comprising coupling at least one of a plurality of inductors to said first bank of varactors and a subsequent at least one of said plurality of inductors to said second bank of varactors.

22. The system according to claim 21, comprising coupling a positive feedback circuit to said at least one of said plurality of inductors, and to said subsequent at least one of said plurality of inductors.

23. The system according to claim 21, comprising coupling a current source circuit to said plurality of inductors.

* * * * *